United States Patent [19]

Switzer

[11] Patent Number: 4,706,104

[45] Date of Patent: Nov. 10, 1987

[54] ELECTRICAL CONTACTS CONTAINING THALLIUM (III) OXIDE

[75] Inventor: Jay A. Switzer, Placentia, Calif.

[73] Assignee: Union Oil Company of California, Los Angeles, Calif.

[21] Appl. No.: 789,564

[22] Filed: Oct. 21, 1985

Related U.S. Application Data

[60] Continuation-in-part of Ser. No. 653,353, Sep. 24, 1984, Pat. No. 4,608,750, which is a division of Ser. No. 518,814, Aug. 1, 1983, Pat. No. 4,492,811, which is a division of Ser. No. 740,182, May 31, 1985, Pat. No. 4,626,322.

[51] Int. Cl.$^4$ .............................................. H01L 23/48
[52] U.S. Cl. ......................................... 357/67; 357/15
[58] Field of Search .................. 357/15, 67; 29/576 R

[56] References Cited

U.S. PATENT DOCUMENTS 4,492,811 1/1985 Switzer ................................ 136/255

Primary Examiner—Andrew J. James
Assistant Examiner—Mark Prenty
Attorney, Agent, or Firm—Dean Sandford; Gregory F. Wirzbicki; Alan H. Thompson

[57] ABSTRACT

Electronic semiconductor devices are prepared having contacts forming rectifying and non-rectifying junctions between thallium (III) oxide and semiconductors. Such contacts may be formed at relatively low temperatures during preparation of bipolar, unipolar and microwave semiconductor devices.

23 Claims, No Drawings

ELECTRICAL CONTACTS CONTAINING THALLIUM (III) OXIDE

RELATED APPLICATION

This application is a continuation-in-part application of U.S. patent application Ser. No. 653,353, filed Sept. 24, 1984 and now U.S. Pat. No. 4,608,750, which is a divisional application of U.S. patent application Ser. No. 518,814, filed Aug. 1, 1983 now U.S. Pat. No. 4,492,811, and U.S. patent application Ser. No. 740,182, filed May 31, 1985 and now U.S. Pat. No. 4,626,322, which is a continuation-in-part application of U.S. patent application Ser. No. 653,353.

BACKGROUND OF THE INVENTION

1. Field of the Invention

This invention relates to electronic semiconductor devices, their use, and method of preparation. More particularly, this invention relates to a material useful for an electrical contact with a semiconductor material.

2. Description of the Prior Art

In the manufacture of electronic semiconductor devices, it is necessary to contact materials to semiconductors that form both rectifying and non-rectifying junctions. The active region of the device may be a specific arrangement of contacts that form rectifying and non-rectifying junctions, while the interconnect contacts are generally junctions that are non-rectifying in nature.

Contacts that form rectifying junctions through which electrical current flows in one direction against very low resistance and against a very high resistance in the reverse direction are typically formed between two semiconductors, between a metal and a semiconductor, or between two doped regions of a semiconductor. Contacts that form non-rectifying junctions through which electrical current flows against low resistance in both directions may also be formed between metals and/or semiconductors. A contact forming a non-rectifying junction has a resistance relative to the bulk resistance of the semiconductor such that the contact does not significantly perturb device performance, and it can supply the required current with a voltage drop that is sufficiently small compared with the drop across the active region of the device. In contrast, a contact forming a rectifying junction has a high resistance relative to the bulk resistance of the semiconductor, and thus provides a low reverse saturation current.

A contact forming a rectifying junction is often formed in a homojunction device by doping a semiconductor like silicon so that a p-n junction is formed. The dopants are generally thermally diffused into the semiconductor. The high process temperatures necessary to effect diffusion are often detrimental to devices such as very large scale integrated circuits (VLSI). Contacts forming rectifying junctions can also be formed at lower temperatures at metal-semiconductor Schottky-barriers of heterojunction semiconductor-semiconductor contacts. In all cases, including both the hetero- and homojunction cases, the rectifying property is induced by the energetic mismatch of the Fermi levels of the two materials. A quantitative measure of this mismatch is the barrier height. The larger the barrier height, the lower the reverse saturation current.

In metal-semiconductor Shottky-barrier devices based on n-silicon, metals with large work functions contact semiconductors to form highly rectifying junctions. (As used herein, the work function of a metal is the minimum energy necessary for an electron of the metal to escape into vacuum from an initial energy at the Fermi level of the metal.) The largest barrier height observed with n-silicon is approximately 0.8–0.9 V (S. M. Sze, *Physics of Semiconductor Devices*, Second Edition, Wiley, N.Y., 1981, herein known as "Sze," p. 291). The sum of the barrier heights for a given metal film on n- and p-type semiconductors theoretically equals the band gap of the semiconductor. However, surface states that form during device fabrication often result in reduced barrier heights due to Fermi-level pinning. Such pinning can usually be eliminated by growing a film of insulating material (e.g., $SiO_x$) of tunneling dimensions (e.g. 10–20 Angstroms) between the substrate semiconductor and the coating material.

The search continues for materials used to effectively form rectifying and non-rectifying junctions with semiconductors. Accordingly, in the case of contacts forming rectifying junctions, it is desirable to form a junction with a very large barrier height and a low number of surface states, while a junction with a low barrier height is desirable for contacts forming non-rectifying junctions. It is also desirable to form such junctions at low temperatures.

It is therefore a major object of this invention to provide an electronic semiconductor device having a contact that forms an effective rectifying (high barrier height) and/or non-rectifying junction between semiconductor materials.

Another object of this invention is to provide an electronic semiconductor device having contacts forming rectifying and/or non-rectifying junctions prepared at relatively low temperatures.

These and other objects and advantages of this invention will become apparent from the following description.

SUMMARY OF THE INVENTION

In the fabrication of electronic semiconductor devices, an n-type semiconductor is contacted with thallium (III) oxide to form a rectifying junction and a p-type semiconductor is contacted with thallium (III) oxide to form a non-rectifying junction. In one embodiment, thallium (III) oxide is contacted with an n-type semiconductor, such as n-type silicon, to provide a rectifying junction between the n-type semiconductor and the thallium (III) oxide. In another embodiment, thallium (III) oxide is contacted with a p-type semiconductor, such as p-type silicon, to provide a non-rectifying junction between the p-type semiconductor and the thallium (III) oxide.

The electronic semiconductor devices of the invention are prepared by a method wherein the thallium (III) oxide is deposited onto the n-type or p-type semiconductors at a relatively low temperature, generally wherein the bulk of the semiconductor is at a temperature less than 500° F., and ordinarily about room temperature, during the deposition. Such a method includes electroless, photoelectroless, electrochemical, and photoelectrochemical deposition of thallium (III) oxide onto a semiconductor substrate.

Such contacts that form junctions to the semiconductors may be utilized in electronic semiconductor devices, e.g., bipolar devices, unipolar devices, and microwave devices. The method of the invention is useful in the preparation of large scale and very large scale integrated circuits.

DETAILED DESCRIPTION OF THE INVENTION

The invention is directed to an electronic semiconductor device containing a contact forming a rectifying junction with an n-type semiconductor substrate and a device containing a contact forming a non-rectifying junction with a p-type semiconductor substrate, and preferably to heterojunction devices containing thallium (III) oxide on a substrate containing a p-type or n-type silicon. The device using the thallium (III) oxide - n-type semiconductor junction is particularly well suited for rectifying use as a diode, whereas the thallium(III) oxide - p-type semiconductor is well suited for use as a non-rectifying or ohmic contact.

Substrates useful in the present devices include materials containing at least one semiconductor. Ordinarily, the substrate is in the form of a single crystalline, polycrystalline, or amorphous structure, or combinations thereof. Oftentimes, two or more semiconductor materials are combined together in various proportions (such as solid solutions) or layers resulting in a final substrate having a desired volume resistivity. The semiconductor material contained in the substrate may be either intrinsic materials or suitably doped n-type or p-type materials.

Semiconductor materials for use in the invention preferably contain (1) elemental semiconductors such as selenium, silicon and germanium, (2) the binary group semiconductors such as Group III-V semiconductors including, for example, GaAs, InP, GaP, and AlSb, (3) the group II-VI semiconductors including, for example, CdS, CdSe, and CdTe, (4) the metal-containing chalcogenides, particularly those containing transition metals such as the selenides, tellurides and sulfides of tungsten and molybdenum, or (5) the Group I-III-VI ternary semiconductors such as $CuInS_2$, $CuInSe_2$, and $CuInTe_2$. Highly preferred semiconductor materials are usually selected from the group consisting of silicon, GaAs, InP, CdSe, and GaP. The most highly preferred semiconductor material is silicon.

The device of the invention contains a highly conductive n-type degenerate thallium (III) oxide that contacts the substrate forming a junction with the semiconductor material. Although only a relatively thin layer of thallium (III) oxide may be used, the substrate may be coated with a thallium (III) oxide layer thicker than the substrate. In some instances, the substrate may be coated with a thin layer of a thickness less than about $10^5$ angstroms and sometimes less than about $2\times10^3$ angstroms.

In the case of thallium (III) oxide contacting a p-type semiconductor, the junction typically manifests a low contact resistance, typically less than about 10 ohm-$cm^2$, preferably less than about 5 ohm-$cm^2$ and most preferably less than one ohm-$cm^2$. On the other hand, the n-type semiconductor - thallium (III) oxide junction exhibits excellent rectifying characteristics, including for instance, a low diode quality factor and a large barrier height. A typical quality factor for the thallium (III) oxide - n-type semiconductor junction is about 1.0 to about 2.0, and preferably between 1.0 and 1.5. The barrier heights for the thallium (III) oxide - n-type semiconductor is unusally high and typically approaches at least 70 percent, preferably 80 percent and most preferably at least 90 percent of the value of the band gap of the semiconductor contained in the substrate. For example, the junction of thallium (III) oxide - n-type silicon exhibits a barrier height of 1.05 e.V., i.e., at least 90 percent of the band gap of silicon (1.12 e.V., see Sze at p. 291). Furthermore, the rectifying junction has a breakdown voltage of at least 5.0 V and preferably at least 9.0 V.

An unusual feature of the thallium (III) oxide material used in the invention is its high conductivity. The conductivity of the thallium (III) oxide material is typically greater than that of the substrate material. In general, the conductivity is sufficient to allow a substantial passage of current through a device of the invention, as manifested by a series resistance less than about 100 ohms, preferably less than 10 ohms and most preferably less than one ohm, during operation of a device. The resistivity of the thallium (III) oxide material, as a measure of its conductivity, is generally less than about $10^{-2}$ ohm-cm, preferably less than about $10^{-3}$ ohm-cm, most preferably less than about $10^{-4}$ ohm-cm, depending upon such factors as crystallinity, purity and method of preparation.

In contrast to the substrate semiconductor material, the thallium (III) oxide is essentially degenerate, either naturally degenerate or doped to degeneracy. Degeneracy, as used herein, is the condition of a material wherein its Fermi energy level is at least, and preferably greater than that of the minimum energy of its conduction band for an n-type material or, in the case of p-type materials, the Fermi level is at most, and preferably less than, that of the maximum energy of its valence band. Thallium (III) oxide, whether doped to degeneracy or naturally degenerate, generally has a doping density of at least $10^{18}$ $cm^{-3}$. Materials used to dope thallium (III) oxide to degeneracy include either electron donors or acceptors, depending upon the nature of the coating and substrate materials.

Layers of insulating materials may form on the surface of the uncoated substrate utilized in the invention. Such layers, in some cases, may contribute to an increase in the rectification or non-rectification of the n-type or p-type semiconductor substrate, respectively. In heterojunction devices of the invention, the thallium (III) oxide contacts and at least, in part, covers such layers of the insulator-type material. The insulator-type material contained in the device may be intentionally formed on the substrate. Layers of the insulator-type materials may be "naturally grown," as by allowing components of air, such as oxygen, to interact with the surface of the substrate, or layers may also be formed by other techniques such as heating the substrate or by conventional deposition. Usually, the insulator-type materials have an average thickness less than about 100 angstroms, preferably between about one and about 50 angstroms and most preferably from about two to about 20 angstroms, as measured by ellipsometry and conventional surface spectroscopy techniques, as for example, the Auger depth profiling technique. An example of the effects of the thallium (III) oxide over insulating materials is demonstrated when the surface of an uncoated n-type silicon-containing substrate is oxidized in contact with air, oxygen or another oxidizing agent from a redox couple so as to produce a thin layer of an oxide of silicon, such as silicon dioxide.

To prepare the junction, a surface of the substrate, in some cases containing a portion of the insulator material, is contacted with the thallium (III) oxide. The contacting may be accomplished by techniques including vacuum evaporation, sputtering, chemical vapor deposition (CVD), spray pyrolysis, laser-enhanced or highly collimated light-enhanced deposition (including direct writing) and mechanical methods such as brushing, spraying and impregnation. It is preferred to contact thallium (III) oxide with an n-type or p-type semiconductor wherein the bulk of the semiconductor has a temperature less than about 500° F., preferably less than 215° F., and most preferably less than 110° F. during the depositing of a portion of the thallium (III) oxide on the substrate. Also, it is preferred to contact thallium (III) oxide with polished and/or etched substrate materials.

Conventional techniques may be employed for preparing conducting means from the thallium (III) oxide to the external circuit or from the n-type or p-type semiconductor substrate portion to the external circuit of a device. Ordinarily, an ohmic electrode contact containing conductive materials such as metals, solders, epoxies, eutectics, alloys, and combinations thereof, is formed with the thallium (III) oxide and the substrate portion of the device; however, low pressure contacts, such as mechanically pressed contacts may also be employed. The ohmic electrodes, particularly those between the thallium (III) oxide and conducting means to the external circuit, may be constructed as a single-point contact or multiple-point contacts such as perimeter contacts or interconnecting grid configurations. Conducting means to the external circuit, such as a wire, may conveniently be constructed with the device of the invention, and with components of other electronic semiconductor devices, such as those in series or parallel circuits with the device of the invention.

The substrate may also be contacted with thallium (III) oxide by an electrochemical or a photo-assisted electrochemical deposition technique. In the electrochemical deposition technique, the thallium (III) oxide is deposited on the surface of a substrate employed as an anode or cathode in an electrochemical cell that contains a redox couple comprising thallium (III) oxide precursors. The electrochemical cell is preferably biased with electrical energy from an external source, and furthermore, the thickness of the coating material on the substrate may conveniently be controlled by monitoring the current, such as by measuring the coulombs per unit area passed through the cell. Control of the thickness of the thallium (III) oxide relative to the coulombs passed through the cell is dependent upon such factors as cell stoichiometry, current efficiency and density of the thallium (III) oxide. A galvanostatic anodization technique may be utilized wherein a constant current is employed in the cell while variation in the voltage occurs during deposition. Substrates containing p-type semiconductors are usually employed as anodes and those containing n-type semiconductors as cathodes.

The electrochemical deposition of thallium (III) oxide on the substrate is preferably photo-assisted, especially in the case of deposition onto n-type semiconductors. In this photoelectrochemical deposition technique, the substrate, employed as an anode or cathode or both, absorbs sufficient light during the operation of the cell to generate a photocurrent, and the thallium (III) oxide deposited on the substrate from a redox couple typically contained in a liquid containing the thallium (III) oxide precursor. Ordinarily, the cell is biased, and in this case, substrates containing n-type semiconductors are employed as anodes and p-type semiconductors as cathodes.

An unusual feature of the invention is a photo-assisted potentiostatic deposition technique for depositing the thallium (III) oxide onto the n-type or p-type semiconductor-containing substrate. In such a technique, a constant voltage is employed in the cell while the current tends to pass through a maxiumum range of values during the time of cell operation. When uniform thin films are desired, the average thickness of the thallium (III) oxide is preferably optimized when the deposition process is stopped at such time that the photocurrent approaches within 20 percent of, and preferably reaches, its maximum value. Such a technique results in highly uniform layers of the thallium (III) oxide on the n-type or p-type semiconductor-containing substrate, and the electronic semiconductor device prepared therefrom. It is believed that high uniformity is due to the deposition rate being fastest where the film is thinnest.

Although biasing of the electrochemical cell during production of the device of the invention is usually done with an external source of electrical energy to the cell, an internal source of energy may serve to replace all or part of the electrical biasing. Such a variation is the electroless deposition process wherein electrical biasing is replaced by the energy generated from the oxidation and/or reduction of a selected redox couple. The electroless deposition process is preferably photo-assisted.

In a highly preferred embodiment for preparing a semiconductor device of the invention, a thallium (III) oxide "rectifying contact" is electrochemically deposited on an n-type silicon semiconductor substrate at the anode of an electrochemical cell. During deposition of the thallium (III) oxide, such a cell is preferably electrically biased, and light is directed toward the n-type silicon anode while a thallium (I) ion-containing solution is oxidized to thallium (III) containing components on the silicon surface. The galvanostatic anodization technique is preferred, and the potentiostatic anodization deposition technique is most highly preferred, especially for relatively thin films of thallium (III) oxide such as films less than about 2000 angstroms thick. Conducting means to the external circuit, such as ohmic electrodes containing such highly conductive materials as silver epoxy or gallium/indium, are attached to the thallium (III) oxide surface and to the n-type silicon surface.

In another highly preferred embodiment for preparing a semiconductor device of the invention, a thallium (III) oxide "non-rectifying contact" is electrochemically deposited on a p-type silicon semiconductor substrate at the anode of an electrochemical cell. During deposition of the thallium (III) oxide, such a cell is preferably electrically biased, while a thallium (I) ion-containing solution is oxidized to thallium (III) containing components on the p-type silicon surface. Either the galvanostatic or potentiostatic anodization deposition technique is preferred for relatively thin films of thallium (III) oxide, such as films having a thickness less than about 2000 angstroms. Conducting means to the external circuit, such as ohmic electrodes containing such highly conductive materials as silver epoxy or gallium/indium, are attached to the thallium (III) oxide surface and to the p-type silicon surface.

The electronic semiconductor devices prepared in accordance with the invention are employed under conditions suited for their intended purposes, as for example, in a process for transmitting either relatively small or large currents in an electric circuit or for rectifying small or large currents (diodes, triodes, and the like). For example, the rectifying characteristics of the contact forming the n-type semiconductor - thallium (III) oxide heterojunction can be employed in the same manner as the n-p junction is employed in such electronic semiconductor devices as bipolar devices, unipolar devices, microwave devices, and the like. Additionally, the contact forming the p-type semiconductor - thallium (III) oxide heterojunction can be employed in the above-mentioned devices as a non-rectifying or ohmic contact.

During operation of one embodiment of the invention, electrical current is readily passed in both forward and reverse directions (non-rectified) across a heterojunction formed from the contact of n-type degenerate thallium (III) oxide and a p-type semiconductor, such as silicon, in an electronic semiconductor device. In some instances, the heterojunction allows passage of the electrical current to the extent that the heterojunction is essentially ohmic. Typically, the contact resistance is less than about 10 ohm-cm$^2$, preferably less than about 5 ohm-cm$^2$, and most preferably less than about 1 ohm-cm$^2$. (For calculation of contact resistance as used herein see Sze, p. 304). Also, in an alternative to this embodiment, the heterojunction may contain an insulator-type layer having a thickness of about 10 to about 20 angstroms between the thallium (III) oxide and the p-type semiconductor.

During operation of another embodiment of the invention, electrical current is passed in an electronic semiconductor device in one direction and essentially blocked in the reverse direction (rectified) across a heterojunction formed from the contact of n-type degenerate thallium (III) oxide and an n-type semiconductor, such as silicon. Typically, the diode quality factor of the heterojunction is between 1.0 and 2.0, the barrier height is at least 70 percent of the band gap of the n-type semiconductor, and the breakdown voltage is at least about 5.0 V.

The invention is further illustrated by the following examples which are illustrative of specific modes of practicing the invention and are not intended as limiting the scope of the invention defined by the appended claims.

EXAMPLE I

An ohmic contact is formed with aluminum on the back of a 15 mil thick silicon p-type substrate material doped with boron to a volume resistivity of 1.2–2.0 ohm-cm, having been etched with a 10 percent HF solution. A copper wire is attached to the ohmic contact with conducting silver epoxy and all surfaces, except the front, are sealed in a glass tube with insulating epoxy and silicone sealant.

The front surface is polished to a mirror finish and placed in an alkaline (pH 14) solution of 0.5M thallium (I) acetate and electrolyzed at a constant potential (i.e. potentiostatic anodization) of 0.1 V vs. SCE (Saturated Calomel Electrode). Approximately 0.15 anodic coulombs per square centimeter of charge passes such that the deposition of the silicon is stopped when the thallium (III) oxide has an average thickness of about 1800 angstroms. A front ohmic electrode is formed with the thallium (III) oxide coating surface by mechanically pressing a copper wire to the thallium (III) oxide front surface.

During operation of the semiconductor device, the copper wires are attached to the external circuit and the observed current characteristics when the device is operated at different applied voltages are summarized in Table I.

TABLE I

| Voltage | Current (mA/cm$^2$) |
|---|---|
| 1.0 | 148 |
| 0.9 | 129 |
| 0.8 | 110 |
| 0.7 | 92 |
| 0.6 | 75 |
| 0.5 | 58 |
| 0.4 | 42 |
| 0.3 | 28 |
| 0.2 | 17 |
| 0.1 | 7 |
| 0.0 | 0 |
| −0.1 | −7 |
| −0.2 | −13 |
| −0.3 | −23 |
| −0.4 | −32 |
| −0.5 | −40 |
| −0.6 | −48 |
| −0.7 | −57 |
| −0.8 | −62 |
| −0.9 | −68 |
| −1.0 | −72 |

The data in Table I indicate the non-rectifying nature of the thallium (III) oxide and p-type silicon. Also at corresponding positive and negative applied biases near 0.0 V, the p-type silicon - thallium (III) oxide junction exhibits essentially ohmic contact characteristics.

EXAMPLE II

A semiconductor device A is prepared in a similar manner to that of Example I, except the silicon substrate (1) is n-type silicon doped with phosphorus to a volume resistivity of 1.2–2.0 ohm-cm, (2) is electrolyzed at a constant potential of 0.5 V vs. SCE, and (3) the copper wire pressed to the thallium (III) oxide is changed to gold wire. Also, the thallium (III) oxide is photoelectrochemically deposited onto the substrate from an irradiation with 50 to 100 MW/cm$^2$ Xenon light and the average thickness is about 1200 angstroms.

A semiconductor device B is prepared in a similar manner to that of device A except the front contact is formed with the thallium (III) oxide deposited surface being immersed in an alkaline ferrocyanide/ferricyanide aqueous solution [0.1 m/0.25 m Fe(CN)$_6^{3-}$/Fe(CN)$_6^{4-}$]. The thallium (III) oxide has an average thickness of 2000 angstroms.

During operation of the above-mentioned devices, characteristics including current densities (−log) at applied voltages from 0.15 V to 0.5 V, dark saturation current density, barrier height and diode quality factor are summarized in Table II as follows:

TABLE II

| | Device A | Device B |
|---|---|---|
| | -log Current Density | |
| Voltage (V) | (A/cm$^2$) | |
| .15 | 5.62 | 7.2 |
| .175 | 5.39 | 6.8 |
| .20 | 5.16 | 6.5 |
| .225 | 4.93 | 6.2 |
| .25 | 4.70 | 5.7 |
| .275 | 4.48 | 5.5 |
| .30 | 4.26 | 5.1 |
| .325 | 4.05 | 4.7 |
| .35 | 3.83 | 4.4 |
| .375 | 3.60 | 4.0 |

TABLE II-continued

| Voltage (V) | Device A | Device B |
|---|---|---|
| | -log Current Density (A/cm$^2$) | |
| .40 | 3.37 | 3.6 |
| .425 | 3.16 | 3.3 |
| .45 | 2.95 | 2.8 |
| .475 | 2.71 | 2.5 |
| .5 | 2.52 | 2.2 |
| Dark Sat. Curr. Density, $J_s$ | 7.9 × 10$^{-8}$ A/cm$^2$ | 6.6 × 10$^{-10}$ A/cm$^2$ |
| Barrier Height | 0.83 V | 0.96 V |
| Diode Quality Factor | 1.8 | 1.2 |

The data in Table II indicate the rectifying nature of the junction between thallium (III) oxide and n-type silicon. The relatively low diode quality factors and the relatively large barrier heights indicate excellent rectification properties of the n-type silicon - thallium (III) oxide junction.

EXAMPLE III

A semiconductor device C is prepared in a similar manner to that of device A in Example II, except the wire contacting the thallium (III) oxide is copper instead of gold.

The flat band voltages of device B from Example II and device C are determined by Mott-Schottky analysis of capacitance-voltage measurements at several frequencies and are summarized together with corresponding barrier heights in Table III as follows:

TABLE III

| | Device C | | Device B | |
|---|---|---|---|---|
| Frequency (Hz) | $V_{FB}$ (V) | Barr. Ht. (V) | $V_{FB}$ (V) | Barr. Ht. (V) |
| 10K | 0.81 | 1.05 | 0.79 | 1.03 |
| 400K | 0.77 | 1.01 | 0.78 | 1.02 |
| 1 M | 0.75 | 0.99 | 0.80 | 1.04 |
| 4 M | 0.75 | 0.99 | 0.81 | 1.05 |
| 10 M | 0.76 | 1.00 | 0.74 | 0.98 |

The data in Table III indicate the consistency of the relatively high barrier height measurement of the rectifying junction formed from the contact of thallium (III) oxide with the n-type silicon substrate. Such measurements (1) indicate that barrier height determinations of the heterojunction are not dependent upon the applied frequency and (2) corroborate the barrier height determinations in Example II.

While particular embodiments of the invention have been described, it will be understood, of course, that the invention is not limited thereto since many obvious modifications can be made, and it is intended to include within this invention any such modifications as will fall within the scope of the invention as defined by the appended claims.

I claim:

1. An electronic semiconductor device having at least one contact forming a non-rectifying junction, said non-rectifying junction containing thallium (III) oxide and a p-type semiconductor.

2. The device defined in claim 1 wherein said p-type semiconductor is selected from the group consisting of silicon, GaAs, InP, CdSe and GaP.

3. The device defined in claim 1 wherein said p-type semiconductor is p-type silicon.

4. The device defined in claim 1 selected from the group consisting of unipolar, bipolar and microwave devices.

5. The device defined in claim 1 wherein said contact has a resistance less than about 10 ohm-cm$^2$.

6. The device defined in claim 1 further comprising at least one additional contact forming a rectifying junction wherein said additional contact contains thallium (III) oxide and an n-type semiconductor.

7. The device defined in claim 1 used in very large scale integrated circuits.

8. An electronic semiconductor device having at least one contact forming a rectifying junction, said rectifying junction containing thallium (III) oxide and an n-type semiconductor.

9. The device defined in claim 8 wherein said n-type semiconductor is selected from the group consisting of silicon, GaAs, InP, CdSe and GaP.

10. The device defined in claim 8 wherein said n-type semiconductor is n-type silicon.

11. The device defined in claim 8 selected from the group consisting of unipolar, bipolar and microwave devices.

12. The device defined in claim 8 wherein said contact has a diode quality factor from about 1.0 to about 2.0.

13. The device defined in claim 8 wherein said contact has a breakdown voltage greater than about +9.0 V.

14. The device defined in claim 8 used in very large scale integrated circuits.

15. A method for producing an electronic semiconductor device comprising the step of depositing solid n-type degenerate thallium (III) oxide onto a surface of a p-type semiconductor component of said device so as to form a non-rectifying junction with said surface of said semiconductor component.

16. The method defined in claim 15 wherein said electronic semiconductor device is selected from the group consisting of unipolar, bipolar and microwave devices.

17. The method defined in claim 15 used in the preparation of very large scale integrated circuits.

18. A method for producing an electronic semiconductor device comprising the step of depositing solid n-type degenerate thallium (III) oxide onto a surface of a n-type semiconductor component of said device so as to form a rectifying junction with said surface of said semiconductor component.

19. The method defined in claim 18 wherein said electronic semiconductor device is selected from the group consisting of unipolar, bipolar and microwave devices.

20. The method defined in claim 18 is used in the preparation of very large scale integrated circuits.

21. The device defined in claim 8 wherein said rectifying junction has a barrier height at least 70 percent of that of the band gap of said n-type semiconductor.

22. The device defined in claim 8 wherein said rectifying junction has a barrier height at least 80 percent of that of the band gap of said n-type semiconductor.

23. The device defined in claim 8 wherein said rectifying junction has a barrier height at least 90 percent of that of the band gap of said n-type semiconductor.

* * * * *